United States Patent [19]
Guhman et al.

[11] Patent Number: 5,611,898
[45] Date of Patent: Mar. 18, 1997

[54] REACTION CHAMBER HAVING IN SITU OXYGEN GENERATION

[75] Inventors: Glenn F. Guhman; Madhukar L. Joshi, both of Chittenden, Vt.

[73] Assignee: International Business Machines Corporation, Armonk, N.Y.

[21] Appl. No.: 450,063

[22] Filed: May 25, 1995

Related U.S. Application Data

[62] Division of Ser. No. 351,868, Dec. 8, 1994, abandoned.

[51] Int. Cl.$^6$ .................... C25B 9/00; C23C 16/00
[52] U.S. Cl. ............ 204/262; 204/265; 204/266; 204/277; 204/278; 118/723 R; 118/723 MP; 118/724
[58] Field of Search ............... 204/277, 278, 204/265, 266; 118/723, 723 HC, 723 MP, 724

[56] References Cited

U.S. PATENT DOCUMENTS

| | | | |
|---|---|---|---|
| 3,843,400 | 10/1974 | Radford et al. | 117/227 |
| 4,267,205 | 5/1981 | Pastor et al. | 437/244 |
| 4,474,829 | 10/1984 | Peters | 437/235 |
| 4,477,541 | 10/1984 | Fraioli | 429/33 |
| 4,522,698 | 6/1985 | Maget | 204/265 |
| 4,563,240 | 1/1986 | Shibata et al. | 156/643 |
| 4,582,657 | 4/1986 | Shibata et al. | 264/40.6 |
| 4,648,955 | 3/1987 | Maget | 204/265 X |
| 4,725,346 | 1/1988 | Joshi | 204/242 |
| 4,832,818 | 5/1989 | Sekido et al. | 204/412 |
| 4,839,018 | 6/1989 | Yamanda et al. | 204/426 X |
| 4,879,016 | 11/1989 | Joshi | 204/242 |
| 4,885,142 | 12/1989 | Suitor et al. | 204/265 X |
| 4,935,118 | 6/1990 | Agarwal et al. | 204/421 |
| 5,167,716 | 12/1992 | Boitnott et al. | 118/724 X |

FOREIGN PATENT DOCUMENTS 02191325A  10/1988  Japan.

*Primary Examiner*—Donald R. Valentine
*Attorney, Agent, or Firm*—Heslin & Rothenberg, P.C.

[57] ABSTRACT

The present invention encompasses a semiconductor processing device having a processing chamber in which is positioned an electrolyte oxygen pump assembly and tubing for transferring an oxygen containing gas from outside the reaction chamber to within the interior of the electrolyte oxygen pump assembly and tubing for removal of the oxygen depleted gas from within the interior of the electrolyte oxygen pump assembly. In addition, the semiconductor processing tool may further have heating elements for heating a semiconductor substrate within the processing chamber independently from heating of the electrolyte.

22 Claims, 2 Drawing Sheets

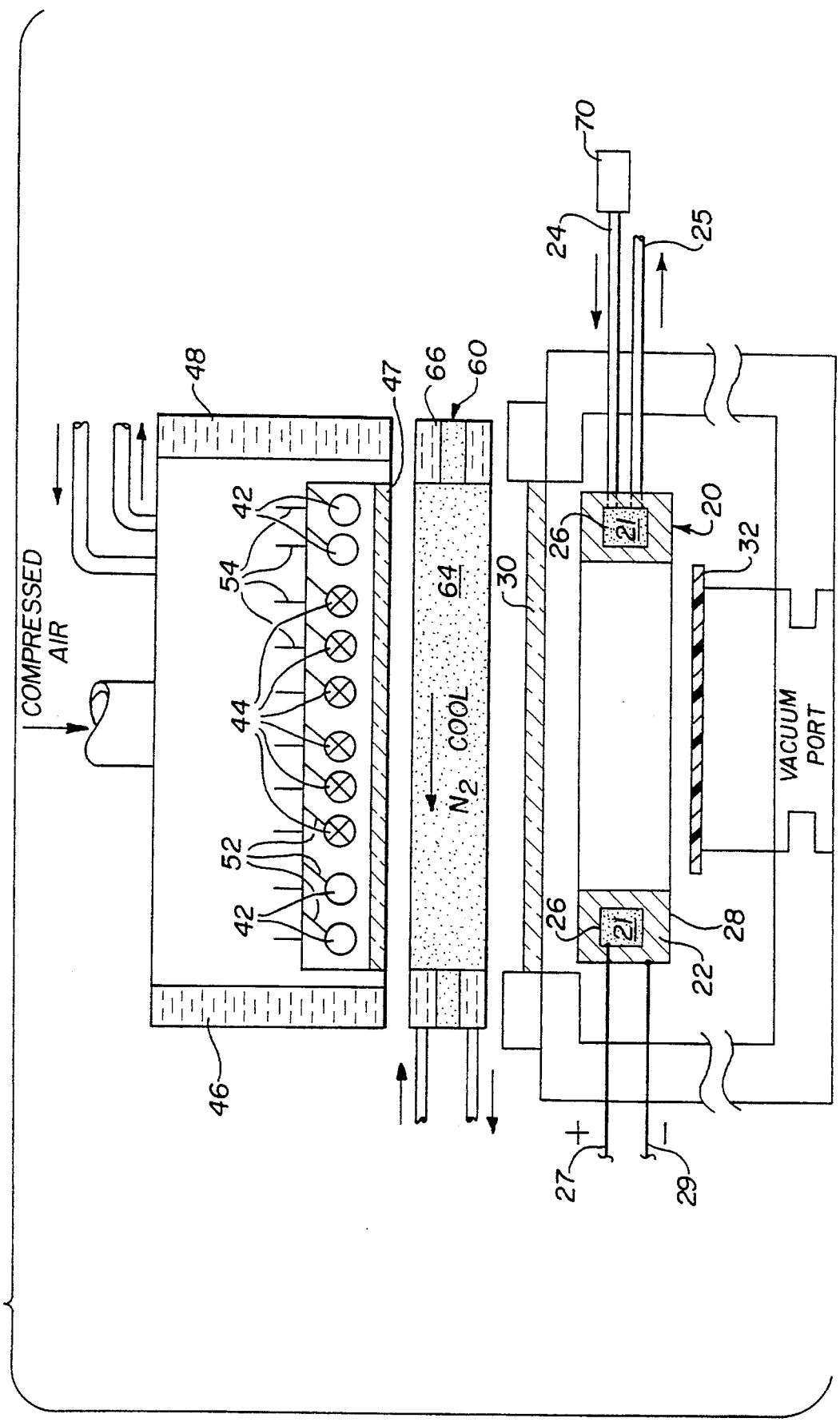

REACTION CHAMBER HAVING IN SITU OXYGEN GENERATION

This application is a division of application Ser. No. 08/351,868, filed Dec. 8, 1994, now abandoned.

TECHNICAL FIELD

The present invention relates to the generation of ultra-pure oxygen within a reaction chamber and, more particularly, to a semiconductor processing device having an electrolyte cell oxygen pump assembly positioned within the processing chamber of the device.

BACKGROUND OF THE INVENTION

In order to remain cost competitive, VLSI and ULSI technologies have been incorporating ever increasing device densities within their structures. Accordingly, the technology of producing such semiconductor devices has been continually pressured to fabricate individual devices which occupy decreased surface area and yet which provide at least the same level of reliability. For example, reduction of the surface area utilized by storage capacitors has been achieved by incorporating a three-dimensional design in the vertical dimension (e.g. fingered structures) upon which may be utilized ultrathin capacitor dielectric materials, typically a silicon oxide or silicon oxynitride material. Accordingly, this continuous shrinking of device structures and the use of more complex device structures has likewise made it desirable to use superior (and thereby thinner) gate oxides, passivation layers and dielectric layers. Accordingly, there exists a need for tools capable of making superior oxide films which retain desired characteristics, such as high $V_{BD}$ (Voltage breakdown strength represents the amount of voltage which can be placed across an insulator before a significant amount of electrons begin to pass therethrough) and a high uniformity and reliability relative to that of thicker films.

Production of high quality thin films on a silicon surface requires a "clean" silicon surface. However, silicon surfaces may pick up contaminants in numerous ways. For example, when silicon is exposed to even mild oxidants, e.g. $H_2O$, a "nascent" oxide is naturally formed on the silicon surface. Therefore, exposure of the silicon substrate to common oxidants, such as those found in the ambient atmosphere, tends to contaminate the silicon surface and prevent formation of a high quality film thereon. In addition to common oxidants, airborne bacteria may become situated on the silicon substrate thereby preventing the effective formation of a high quality film. Similarly, particulate contaminants naturally found within the atmosphere may likewise become situated on the silicon substrate thereby degrading the resulting uniformity and $V_{BD}$ of a film formed on the silicon substrate.

Contaminants commonly find their way into reaction chambers of semiconductor processing devices in numerous ways, such as via plumbing, valves and junctions. Contaminants may often be found within the bottled air supplies themselves or may enter the air supply (intended for the processing chamber) upon hooking-up or changing of air supply bottles and tanks. Moreover, the tubing or plumbing utilized to connect gas supplies with the processing chamber may itself become a source of contaminants. For example, bacteria once having entered the plumbing, may become attached thereto and begin to grow, thereby creating a continuous and increasing source of organic contaminants. Similarly, due to changes in humidity and temperature it is also possible to get condensation within the plumbing. Therefore, there exists a need for a processing tool capable of reducing the level of contaminants introduced into the processing chamber while still permitting introduction of an ultrapure gas, such as oxygen, into the processing chamber.

SUMMARY OF THE INVENTION

The present invention satisfies the aforementioned needs and solves problems experienced by existing processing tool designs. More particularly, the present invention encompasses a semiconductor processing device having a processing chamber in which is positioned an electrolyte cell oxygen pump assembly for generating ultra-pure oxygen and a means for supplying gas to the interior of the pump. The oxygen pump assembly is positioned such that oxygen leaving the pump enters directly into the processing chamber.

The device described above, for example, may position the oxygen pump assembly within the processing chamber. The oxygen pump assembly may use an electrolyte chosen from the group selected from zirconia, hafnia, ceria and bismuth oxide. The electrolyte cell of the pump assembly may be circular in cross-section (i.e. a tubular cell) and the tubular element may be disposed in helical pattern.

The device described above may further comprise a separate means for heating the electrolyte, whereby heating of the electrolyte may be controlled independently from either heating of a semiconductor substrate within the processing chamber or biasing of electrodes within the oxygen pump assembly. The device may further comprise a means for varying the level of oxygen supplied to the oxygen pump assembly.

In a further aspect, the invention may comprise a method of fabricating a semiconductor device, comprising: placing a semiconductor substrate within a processing chamber of a semiconductor processing tool; flowing an oxygen containing medium from outside said processing chamber to the interior of an electrolyte oxygen pump assembly which is positioned at least partially within the processing chamber; releasing ultra-pure oxygen from the electrolyte oxygen pump assembly directly into the processing chamber; and performing a semiconductor processing step that requires oxygen upon the semiconductor substrate. The above method may further comprise the step of removing the oxygen depleted medium from the interior of the electrolyte oxygen pump assembly.

BRIEF DESCRIPTION OF THE DRAWINGS

FIG. 3 is a cross-sectional side view of a semiconductor processing tool having an electrolyte cell oxygen pump assembly and a means for independently heating a silicon substrate and the electrolyte cell.

DESCRIPTION OF THE INVENTION

The present invention encompasses a semiconductor processing tool or device which utilizes oxygen in processing semiconductor substrates. Utilization of oxygen in semiconductor processing is extremely common and includes the "growth" or deposition of numerous films, examples being silicon oxides and silicon oxynitrides. These films have a wide variety of applicants within semiconductor devices, including capacitor dielectric films, insulation and passivation layers, gate oxides, etc. Examples of semiconductor processing devices which often utilize oxygen during operation include, but are not limited to, plasma oxide reactors and rapid thermal oxidation furnaces.

Figure 1:
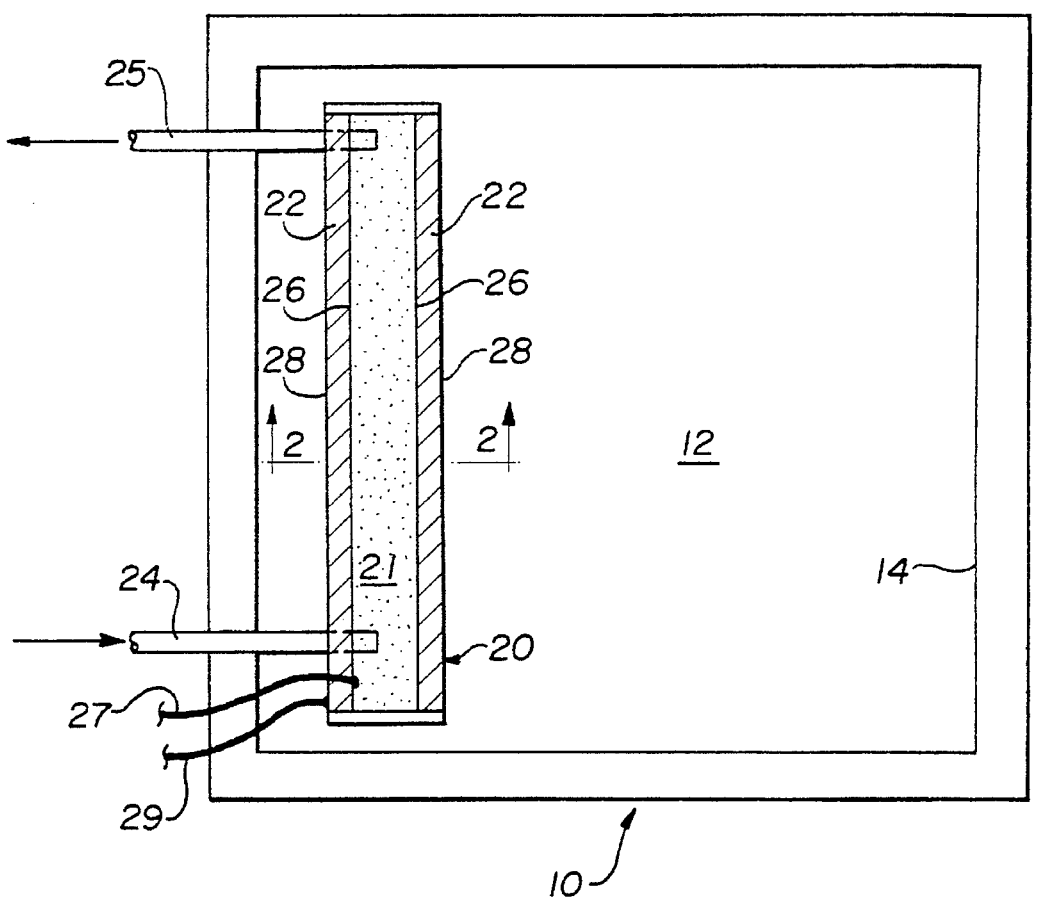
FIG. 1 is a cross-sectional side view of a semiconductor processing tool having an electrolyte cell oxygen pump assembly located within the processing chamber.

As may be seen in reference to FIG. 1, these semiconductor processing tools 10 have a reaction or processing chamber 12 defined by an interior wall 14 in which the individual processing techniques may be performed upon a semiconductor substrate. The design of the processing tool will, of course, vary with the nature and function of the individual tool and is not a limiting factor of the present invention. In this regard, only general elements of processing tools have been shown in the drawings so as to more clearly show and describe the nature of the present invention. Accordingly, the processing tools encompassed by the present invention will often have numerous other elements (not shown) needed to perform their intended function.

Electrochemical oxygen generating and filtering devices employing electrolyte cell assemblies are known. Examples of such electrolyte assemblies are described in greater detail in U.S. Pat. No. 4,879,016 issued to Joshi on Nov. 7, 1989; U.S. Pat. No. 4,725,346 issued to Joshi on Feb. 16, 1988; U.S. Pat. No. 4,477,541 issued to Fraioli on Oct. 16, 1984 and U.S. Pat. No. 3,843,400 issued to Radford et al. on Oct. 22, 1974. The contents of the aforesaid patents are incorporated herein by reference.

As may be seen in reference to FIG. 1, an oxygen containing medium, an example being ambient air, may be fed into the interior of the oxygen pump assembly 21. Evacuating the processing chamber prior to flowing an oxygen containing medium to the interior of the oxygen pump assembly may be performed in order to aid in oxygen generation and remove impurities generated from previous processing steps. The oxygen containing medium may be transferred from outside the processing tool 10 to the interior of the oxygen pump assembly 21 by tubing 24 or other means known in the art. However, in the event the tubing will extend within the interior of the processing chamber 12 it must be constructed of a material capable of withstanding the temperatures and conditions generated within the chamber. Although these conditions will vary with the particular processing tool and intended use of the same, typically stainless steel tubing will be capable of withstanding the conditions involved.

Oxygen pump assembly 20 utilize an electrolyte 22 which may comprised materials such as zirconia, hafnia, ceria or bismuth oxide. The aforesaid electrolytic materials are substantially impervious to gas molecules, such as $N_2$, as well as being impervious to the transfer of particulates. The preferred filter utilizes a zirconia electrolyte cell in which the electrolyte has a pair of surfaces which are substantially parallel, the surfaces either being cylindrical, planar or other convenient shape. However, any electrolyte capable of efficiently filtering oxygen from an oxygen containing medium may be readily adapted for use in the present invention. The electrolyte surfaces will each have an electrode 26 and 28 in contact thereto. The electrodes may take the form of a coating of an electrode material upon the electrolyte surfaces or an electrode in intimate contact with the electrolyte; examples may include, but are not limited to, silver, silver alloys or porous platinum. The electrodes may in turn be connected to means for electrically biasing the electrodes, an example being electrical leads 27 and 29 connected to a battery or distant power supply (not shown). The term "oxygen pump assembly" encompasses the electrolyte, the electrodes and means for electrically biasing the electrodes.

By applying a voltage across the opposing surfaces, via the electrodes 26 and 28, current may be caused to pass through the electrolyte 22. The current carrying means are oxygen ions (O–). As may be seen in reference to FIGS. 1 and 2, a gas containing oxygen is fed into the interior of the oxygen pump assembly by tubing 24. At the positive electrode 26 (anode) oxygen will pick-up electrons forming oxygen ions as represented by the following equation: $O_2 + 4e- \rightarrow 2O-$. The oxygen ions travel across the electrolyte 22 to the negative electrode 28 (cathode) where electrons are removed from the oxygen ion which results in the formation of diatomic oxygen, as represented by the following equation: $2O- \rightarrow 4e- + O_2$. The ultrapure oxygen diffuses through the negative electrode 28 of the oxygen pump assembly 20 into the interior of the processing chamber 12. As used herein the term "ultrapure oxygen" means oxygen of not less than of 99.999% purity.

Figure 2:
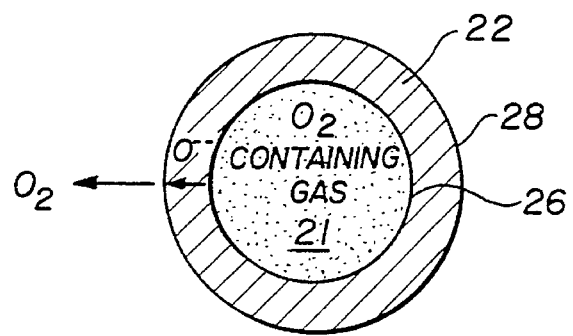
FIG. 2 is a cross-sectional view of the electrolyte cell shown in FIG. 1 taken at 2—2.

An example of such an electrolytic cell may be seen with reference to FIGS. 1 and 2. An electrolyte 22 such as zirconia in a substantially tubular shape has a pair of electrodes, an anode 26 and a cathode 28, on opposite sides of the electrolyte 22. The voltage is applied across the electrolyte material via the opposing electrodes which are supplied current from an outside source. An oxygen containing gas is pumped within the interior of the electrolyte cell 21, and due to the voltage applied across the cell, oxygen ions migrate from the anode 26 to the cathode 28. The oxygen ions are reduced at the cathode forming oxygen ($O_2$) which migrates through the cathode thereby releasing oxygen directly into the processing chamber of the semiconductor processing device. When the source of oxygen provides oxygen in another carrier gas rather than substantially pure oxygen, oxygen-depleted carrier gas is removed from the interior of the electrolyte cell at the other end of the electrolytic cell 20 through tubing 25. Heating of the electrolyte may be accomplished by the electrical biasing of the electrodes or by use of a separate heating element as discussed in greater detail hereinabove.

The oxygen pump assembly 20, which is used to generate ultrapure oxygen, is positioned in relation to the reaction chamber such that the ultrapure oxygen generated by the pump flows directly into the interior of the reaction chamber 12 without first passing through other elements or structures, such as plumbing, valves, junctions, containers, etc. For example, the oxygen pump assembly 20 may be fully contained within the process chamber 12 of the processing tool 10 (as seen in FIG. 1 and FIG. 3) or such that the cathode of the oxygen pump assembly, i.e. the electrode at which the ultrapure oxygen leaves the pump, is positioned within the confines of the interior wall 14 which defines the process chamber 12.

Due to the nature of an electrolytic cell, one skilled in the art will appreciate that it is desirable that each unit area of electrolyte surface be in intimate electrical contact with an equivalent unit area of electrode to maximize the number of ions available per unit area of electrolyte surface. In addition, it will also follow that an increase in the amount of surface area of the electrolyte/electrode interface will respectively increase the number of oxygen molecules capable of being produced by the oxygen pump. In this regard, the shape of the oxygen pump assembly may be designed in accordance with the expected oxygen demands of the particular tool. For example, if the tool will require production of significant amounts of ultrapure oxygen the oxygen pump assembly may be shaped to have a substantially helical, coiled or other pattern in order to increase the surface area of the electrolyte/electrode interface. The specific configuration and positioning of the electrolyte cell pump assembly may be varied according to the nature and intended function of the individual processing tool.

As is known in the art, rapid thermal oxidation furnaces commonly require the ability to rapidly raise the temperature of a silicon substrate in the presence of oxygen. This process is typically done in order to "grow" a silicon oxide film on the silicon substrate. The rate at which the temperature of the substrate is increased and the length of time it remains at the high temperatures in the presence of oxygen may be varied in order to vary the thickness and qualities of the oxide film. However, in many embodiments, the electrolyte cell is heated to a temperature of approximately 500° to 800° C., whereas heating of the substrate for rapid thermal oxidation often exceeds this temperature. Heating the interior of the reaction chamber as a means for heating the silicon substrate may in turn cause the electrolyte to increase in temperature along with the silicon substrate. Therefore, in order to maintain the optimum oxygen output and a substantially uniform flow of ultrapure oxygen it may often be preferable for the semiconductor processing tool to further include a heating means which allows heating of the silicon substrate to be effected separately and independently from heating of the electrolyte. In other words, heating of the two elements may be separately controlled, and in which heating of the silicon substrate does not incidentally cause a significant temperature increase in the electrolyte.

As may be seen in reference to FIG. 3, such a processing tool may include a quartz window 30 over the oxygen pump assembly 20 and the silicon substrate 32. In order to maximize the area of the electrolyte cell while keeping the silicon substrate visible from the quartz window, the electrolyte cell may generally be shaped proximate to the perimeter of the quartz window whereas the silicon substrate may be positioned under the center region of the window. For example, the electrolyte cell may be substantially donut shaped and positioned proximate to the perimeter of the quartz window whereas the planar surface of the silicon substrate may be positioned parallel to the quartz window and centered in the aperture created by the overlaying donut shaped oxygen pump assembly. Heating elements, such as tungsten-halogen lamps, may be placed relative to the oxygen pump assembly and the silicon substrate such that each individual heating element will act to primarily heat either the electrolyte or the silicon substrate.

For example, when using heating lamps 42 and 44, each lamp may be positioned so as to direct substantially all of its UV light on only one of the two elements. In reference to FIG. 3, a first family of heating lamps 42 may be positioned in a generally circular pattern relative to the perimeter of the quartz window 30 and the corresponding positioning of the pump assembly 20 such that substantially all the light produced by these lamps strikes the pump assembly 20. Similarly, a second family of heating lamps 44 may be positioned relative to the interior of the quartz window 30 and the silicon substrate such that substantially all of the light emitted from the second family of lamps strikes the silicon substrate 22.

However, as is known in the art, heating lamps often produce secondary radiation, e.g. thermal radiation, in addition to the intense light. Accordingly, in order to prevent this secondary radiation from heating or otherwise affecting the semiconductor processing tool or the electrolyte, the heating lamps may themselves be placed in a chamber 46 having a quartz window 47 similar in size and shape to the window of the processing tool. This chamber 46 may also have a means for dampening secondary radiation, an example of such a means may include a water jacket 48 positioned on the perimeter of the heating chamber. The chamber 46 may also have a reflector 52 positioned adjacent the heating lamps and opposite the quartz window 30 in order to maximize the efficiency of the heating lamps. Heat sinks 54 may also be positioned adjacent the reflector 52 opposite the heating lamps 42 and 44.

The means for dampening the secondary radiation may further include a barrier 60 between the heating chamber and the processing tool, such a barrier should be capable of substantially prohibiting the transfer of secondary radiation from the heating element to the pump assembly 20. The barrier 60 may comprise two quartz plates in which a coolant 64, such as cooled $N_2$ gas, is flowed therethrough. The coolant may be cooled by any one of numerous means such as by a water jacket 66.

In addition, during processing of the semiconductor substrate it may be desirable to vary the amount of oxygen within the reaction chamber and hence the amount of ultra-pure oxygen produced by the electrolyte oxygen pump assembly. This may be done by varying the voltage across the electrolyte and/or varying the amount of oxygen within the oxygen containing medium supplied to the interior of the oxygen pump assembly. Thus, in some instances it may be desirable to further provide a means for varying the level of oxygen 70 in the oxygen containing medium fed the pump assembly 20. For example, the gas supplied to the electrolytic cell may be an $O_2$/Xe mixture in which the level of $O_2$ is varied in accordance with the amount of $O_2$ ultimately desired to be fed into the processing chamber. Means capable of varying the level of oxygen in a gaseous or other mixture are well known, many of which may be readily adapted for use in the present invention.

While the present invention has been particularly shown and described with reference to preferred embodiments thereof, it will be understood to those skilled in the art that various changes in form and details may be made therein without departing from the spirit and scope of the invention.

What is claimed is:

1. A semiconductor processing device, comprising:

a processing chamber for processing a semiconductor substrate;

an electrolyte oxygen pump assembly for generating ultra-pure oxygen, said assembly being positioned such that ultra-pure oxygen leaving said oxygen pump assembly enters directly into said processing chamber without passing through any intermediate structure, whereby contaminant introduction into said chamber is minimized; and a means for supplying an oxygen containing medium to said oxygen pump assembly.

2. The device of claim 1 wherein said oxygen pump assembly is positioned within said processing chamber.

3. The device of claim 2 wherein said electrolyte is tubular shaped.

4. The device of claim 3 wherein said electrolyte oxygen pump assembly is disposed in a substantially helical pattern.

5. The device of claim 2 further comprising a means for heating said electrolyte.

6. The device of claim 5 wherein said means for heating said electrolyte is positioned outside said processing chamber.

7. The device of claim 6 wherein said means for heating said electrolyte comprises a tungsten-halogen lamp.

8. The device of claim 6 further comprising a means for preventing substantial transfer of secondary radiation from said means for heating said electrolyte to said processing chamber.

9. The device of claim 5 further comprising an independent means for heating a semiconductor substrate.

10. The device of claim 2 further comprising a means for heating a semiconductor substrate.

11. The device of claim 2, further comprising means for separately and independently heating said substrate and an electrolyte of said oxygen pump assembly, respectively.

12. The device of claim 11, wherein said heating means comprises first heating means external to said chamber for primarily heating said substrate, and second heating means external to said chamber for primarily heating said electrolyte.

13. The device of claim 12, wherein said first heating means comprises a first source of primary radiation, said second heating means comprises a second source of primary radiation, substantially all of said primary radiation from said first source being directed toward said substrate, and substantially all of said primary radiation from said second source being directed toward said electrolyte.

14. The device of claim 13 wherein said first source and said second source comprise tungsten-halogen lamps.

15. The device of claim 1 further comprising a means for removing oxygen depleted gas from said oxygen pump assembly.

16. The device of claim 1 wherein the electrolyte of said electrolyte oxygen pump assembly is chosen from the group consisting of zirconia, hafnia, ceria and bismuth oxide.

17. The device of claim 4 wherein the electrolyte comprises zirconia.

18. The device of claim 1 wherein electrodes in said electrolyte oxygen pump assembly comprise silver.

19. The device of claim 1 wherein electrodes in said electrolyte oxygen pump assembly comprise platinum.

20. The device of claim 1 wherein said electrolyte oxygen pump assembly has a substantially donut shape.

21. The device of claim 1 wherein said processing chamber comprises a rapid thermal oxidation furnace.

22. The device of claim 1 wherein said processing chamber comprises a plasma oxide reactor.

* * * * *

UNITED STATES PATENT AND TRADEMARK OFFICE
CERTIFICATE OF CORRECTION

PATENT NO. : 5,611,898

DATED : March 18, 1997

INVENTOR(S) : Guhman et al.

It is certified that error appears in the above-identified patent and that said Letters Patent is hereby corrected as shown below:

Column 8, Line 9, substitute --16-- for "4".

Signed and Sealed this

Twenty-fourth Day of June, 1997

Attest:

BRUCE LEHMAN

*Attesting Officer*     *Commissioner of Patents and Trademarks*